United States Patent
Ye et al.

(10) Patent No.: US 11,435,404 B2
(45) Date of Patent: Sep. 6, 2022

(54) BATTERY FORMATION/TESTING

(71) Applicant: Analog Devices International Unlimited Company, Limerick (IE)

(72) Inventors: Shaoli Ye, Woburn, MA (US); Gina M Kelso, Arlington, MA (US); David J. Lath, Boston, MA (US); William Michael James Holland, Edinburgh (GB); John Jude O'Donnell, Quin (IE)

(73) Assignee: Analog Devices International Unlimited Company, Limerick (IE)

( * ) Notice: Subject to any disclaimer, the term of this patent is extended or adjusted under 35 U.S.C. 154(b) by 100 days.

(21) Appl. No.: 17/034,588

(22) Filed: Sep. 28, 2020

(65) Prior Publication Data

US 2022/0099748 A1    Mar. 31, 2022

(51) Int. Cl.
*G01R 31/00* (2006.01)
*G01R 31/385* (2019.01)
*H01M 10/44* (2006.01)
*G01R 31/36* (2020.01)

(52) U.S. Cl.
CPC ..... *G01R 31/3865* (2019.01); *G01R 31/3648* (2013.01); *H01M 10/446* (2013.01)

(58) Field of Classification Search
USPC .................................................. 324/426, 430
See application file for complete search history.

(56) References Cited

U.S. PATENT DOCUMENTS

| | | | |
|---|---|---|---|
| 9,638,724 B2 | 5/2017 | Hurwitz et al. | |
| 9,823,275 B2 | 11/2017 | Danesh et al. | |
| 9,933,463 B2 | 4/2018 | Danesh et al. | |
| 10,393,817 B2 | 8/2019 | Bruch et al. | |
| 10,414,519 B1 | 9/2019 | Cameron et al. | |
| 10,527,651 B2 | 1/2020 | Wood et al. | |
| 2009/0138225 A1 | 5/2009 | Dorsey et al. | |
| 2017/0254859 A1* | 9/2017 | Christophersen | G01R 31/392 |

(Continued)

FOREIGN PATENT DOCUMENTS

| | | |
|---|---|---|
| CN | 114325419 A | 4/2022 |
| SE | 1851172 A1 | 3/2020 |
| WO | WO-2013038176 A2 | 3/2013 |

OTHER PUBLICATIONS

"Low Cost, Precision Analog Front End and Controller for Battery Test/Formation Systems", (Jan. 1, 2014), 32.

(Continued)

*Primary Examiner* — Vincent Q Nguyen
(74) *Attorney, Agent, or Firm* — Schwegman Lundberg & Woessner, P.A.

(57) ABSTRACT

Techniques for controlling a current of a battery cell during formation and/or testing are described. A current sensor is used to measure the current of the battery cell, which is used as a feedback signal for controlling the current to achieve a target current. The transfer function of the current sensor is used to improve the accuracy of the current measurement. Because the transfer function can be regularly determined during formation/testing, a lower-cost current sensor with relatively poor temperature coefficient may be used. Any change in the gain of the current sensor may be detected by the transfer function determination and corrected for. Therefore, high current control accuracy may be achieved at lower cost.

20 Claims, 4 Drawing Sheets

(56) References Cited

U.S. PATENT DOCUMENTS

2017/0363664 A1 12/2017 Hurwitz et al.
2020/0067147 A1 2/2020 Goto et al.
2022/0099714 A1 3/2022 Ye et al.

OTHER PUBLICATIONS

"Precision Analog Front End and Controller for Battery Test/Formation Systems", (2014-2015), 41.
"European Application Serial No. 21199063.5, Extended European Search Report dated Feb. 21, 2022", 11 pgs.

\* cited by examiner

BATTERY FORMATION/TESTING

FIELD OF THE DISCLOSURE

The present disclosure relates to controlling a battery current during battery formation and/or testing.

BACKGROUND

During the manufacturing process of batteries, such as lithium-ion (Li-Ion) batteries, battery formation is performed. Battery formation is the process of performing the initial charge/discharge operation on the battery cell. During battery formation, a particular charging current and/or voltage is applied to the battery call for a period of time, for example a charging current of 0.1 C (where C is the cell capacity) may be applied for a period of time. The battery may then be controlled to discharge at a particular discharge current over a further period of time in order to complete a full charge and discharge cycle, which may take up to about 20 hours. Battery cells may be also be tested in a similar way, but applying a particular charging current and/or voltage to the cell for a period of time and then controlling the discharge current and/or voltage to a particular discharge profile of the cell to determine whether the cell meets particular charge and discharge requirements.

It may be beneficial to measure and control current and voltage to achieve a high level of accuracy during formation and/or testing of a battery cell. For example, maintaining current and voltage to within ±0.05% of the target values may be desirable. This may be particularly true where many battery cells will be used together and should therefore operate as similarly as possible, for example tens, hundreds or thousands of battery cells to be used together in an electric vehicle. Controlling current and/or voltage with a high level of accuracy typically requires very accuracy measurement of the battery cell voltage and/or current. However, the relatively high currents typically involved in formation/testing often result in temperature increases during formation/testing. Therefore, current and/or voltage sensors with a stable temperature coefficient (tempco), such as 15 ppm/° C., may typically be used.

SUMMARY OF THE DISCLOSURE

The disclosure relates to controlling a formation/testing current of a battery cell during formation and/or testing. A current sensor is used to measure the current of the battery cell, which is used as a feedback signal for controlling the current to achieve a target current. The transfer function of the current sensor is used to improve the accuracy of the current measurement. Because the transfer function can be regularly determined during formation/testing, a lower-cost current sensor with relatively poor temperature coefficient may be used. Any change in the gain of the current sensor may be detected by the transfer function determination and corrected for. Therefore, high current control accuracy may be achieved at lower cost.

In a first aspect of the disclosure, there is provided a battery formation/testing controller for controlling a formation/testing current of a battery cell and for coupling to a current sensor arranged to output a measurement of current flowing through the battery cell, the battery formation/testing controller being configured to: determine a current feedback measurement indicative of the formation/testing current of battery cell, wherein determination of the current feedback measurement is based on a transfer function of the current sensor and the measurement of the current flowing through the battery cell; and control the formation/testing current applied to the battery cell based on a target formation/testing current and the determined current feedback measurement.

The battery formation/testing controller may be further configured to determine the transfer function of the current sensor.

The current sensor may comprise an analog-to-digital converter, ADC, having a non-linearity input range of input signals where analog input signals are converted non-linearly to digital output signals, the battery formation/testing controller further configured to: compare the measurement of the current flowing through the battery cell against the non-linearity input range; and if the measurement of the current following through the battery cell is outside of the non-linearity input range: determine the transfer function of the current sensor.

The battery formation/testing controller may be further configured to determine the transfer function of the current sensor by: applying a reference input signal to the current sensor, such that the current feedback measurement comprises a formation/testing current signal and a reference output signal corresponding to the reference input signal; extracting the reference output signal from the current feedback measurement; and determining the transfer function based on the reference input signal and the reference output signal.

The current sensor may comprises an analog-to-digital converter, ADC, and the battery formation/testing controller may be further configured to: apply a dither to the reference input signal. Applying the dither to the reference input signal may comprise at least one of: transposing the reference input signal between at least two signal levels; modulating the amplitude of the reference input signal.

The battery formation/testing controller may be further configured to: read the transfer function of the current sensor from memory.

The battery formation/testing controller may be further configured to: determine a further transfer function of the current sensor; determine a further current feedback measurement based on the further transfer function and a further measurement of the current flowing through the battery output by the current sensor; and control the formation/testing current of the battery cell based on the target formation/testing current and the determined further current feedback measurement.

The battery formation/testing controller may be further configured to: store in memory the further transfer function for use in determining future current feedback measurements.

The battery formation/testing controller may be further configured to control the formation/testing current of the battery cell by: controlling the operation of one or more transistors configured to control a magnitude of the formation/testing current.

The formation/testing current may be a charging current applied to the battery cell or a discharge current output from the battery cell.

The battery formation/testing controller may be further configured to: determine a voltage feedback measurement indicative of the formation/testing voltage across the battery cell, wherein determination of the voltage feedback measurement is based on a transfer function of a voltage sensor coupled across the battery cell and a measurement of the voltage across the battery cell from the voltage sensor; and control the formation/testing voltage across the battery cell based on a target formation/testing voltage and the determined voltage feedback measurement.

In a second aspect of the present disclosure, there is provided a battery formation/testing system comprising: an analog-to-digital converter, ADC, for coupling to a current transducer that is arranged to generate an analog signal indicative of a current flowing through the battery cell; and a battery formation/testing controller coupled to a digital output of the ADC and configured to: determine a current feedback measurement indicative of a formation/testing current of the battery cell, wherein determination of the current feedback measurement is based on a transfer function of the current sensor and the digital output of the ADC; and control the formation/testing current of the battery cell based on a target formation/testing current and the determined current feedback measurement. The current transducer may comprise a shunt resistor.

In a third aspect of the present disclosure, there is provided a method for controlling a formation/testing current of a battery cell, the method comprising: determining a current feedback measurement indicative of the formation/testing current applied to the battery cell, wherein determination of the current feedback measurement is based on a transfer function of a current sensor arranged to output a measurement of current flowing through the battery cell and the measurement of the current flowing through the battery cell; and control the formation/testing current of the battery cell based on a target formation/testing current and the determined current feedback measurement.

The method may further comprise determining the transfer function of the current sensor.

The current sensor may comprise an analog-to-digital converter, ADC, having a non-linearity input range of input signals where analog input signals are converted non-linearly to digital output signals, and the method may further comprise: comparing the measurement of the current flowing through the battery cell against the non-linearity input range; and if the measurement of the current following through the battery cell is outside of the non-linearity input range: determining the transfer function of the current sensor.

The method may be further configured to determine the transfer function of the current sensor by: applying a reference input signal to the current sensor, such that the measurement of the current flowing through the battery cell comprises a formation/testing current signal and a reference output signal corresponding to the reference input signal; extracting the reference output signal from the measurement of the current flowing through the battery cell; and determining the transfer function based on the reference input signal and the reference output signal.

The current sensor may comprise an analog-to-digital converter, ADC, wherein the method may further comprise: applying a dither to the reference input signal.

In a fourth aspect of the present disclosure, there is provided a battery formation/testing controller for controlling a formation/testing voltage of a battery cell and for coupling to a voltage sensor arranged to output a measurement of voltage across the battery cell, the battery formation/testing controller being configured to: determine a voltage feedback measurement indicative of the formation/testing voltage of the battery cell, wherein determination of the voltage feedback measurement is based on a transfer function of the voltage sensor and the measurement of the voltage across the battery cell; and control the formation/testing voltage of the battery cell based on a target formation/testing voltage and the determined voltage feedback measurement.

The battery formation/testing controller may be further configured to determine the transfer function of the voltage sensor.

The voltage sensor may comprise an analog-to-digital converter, ADC, having a non-linearity input range of input signals where analog input signals are converted non-linearly to digital output signals, the battery formation/testing controller further configured to: compare the measurement of the voltage across the battery cell against the non-linearity input range; and if the measurement of the voltage across battery cell is outside of the non-linearity input range: determine the transfer function of the voltage sensor.

The battery formation/testing controller may be further configured to determine the transfer function of the voltage sensor by: applying a reference input signal to the voltage sensor, such that the measurement of voltage across the battery cell comprises a formation/testing voltage signal and a reference output signal corresponding to the reference input signal; extracting the reference output signal from the measurement of voltage across the battery cell; and determining the transfer function based on the reference input signal and the reference output signal.

The voltage sensor may comprise an analog-to-digital converter, ADC, wherein the battery formation/testing controller is further configured to apply a dither to the reference input signal. Applying the dither to the reference input signal may comprise transposing the reference input signal between at least two signal levels and/or modulating the amplitude of the reference input signal.

The battery formation/testing controller may be further configured to: read the transfer function of the voltage sensor from memory.

The battery formation/testing controller may be further configured to: determine a further transfer function of the voltage sensor; determine a further voltage feedback measurement based on the further transfer function and a further measurement of the voltage across the battery cell by the voltage sensor; and control the formation/testing voltage of the battery cell based on the target formation/testing voltage and the determined further voltage feedback measurement.

The battery formation/testing controller may be further configured to: store in memory the further transfer function of the voltage sensor for use in determining future voltage feedback measurements.

The battery formation/testing controller may be further configured to control the formation/testing voltage of the battery cell by controlling the operation of one or more transistors configured to control a magnitude of the formation/testing voltage of the battery cell.

In a fifth aspect of the present disclosure, there is provided a battery formation/testing system comprising: a voltage sensor comprising an analog-to-digital converter, ADC, for coupling to a battery cell for measuring a voltage across the battery cell; and a battery formation/testing controller coupled to a digital output of the ADC and configured to: determine a voltage feedback measurement indicative of a formation/testing voltage of the battery cell, wherein determination of the voltage feedback measurement is based on a transfer function of the voltage sensor and the digital output of the ADC; and control the formation/testing voltage of the battery cell based on a target formation/testing voltage and the determined voltage feedback measurement.

In a sixth aspect of the present disclosure, there is provided a method for controlling a formation/testing voltage of a battery cell, the method comprising: determining a voltage feedback measurement indicative of the formation/testing voltage of the battery cell, wherein determination of the voltage feedback measurement is based on a transfer function of a voltage sensor arranged to output a measurement of a voltage across the battery cell and the measurement of the voltage across the battery cell; and control the formation/testing voltage of the battery cell based on a target formation/testing voltage and the determined voltage feedback measurement.

The method may further comprise determining the transfer function of the voltage sensor.

The voltage sensor may comprise an analog-to-digital converter, ADC, having a non-linearity input range of input signals where analog input signals are converted non-linearly to digital output signals, and the method may further comprise: comparing the measurement of the voltage across the battery cell against the non-linearity input range; and if the measurement of the voltage across the battery cell is outside of the non-linearity input range: determining the transfer function of the voltage sensor.

The method may be further configured to determine the transfer function of the voltage sensor by: applying a reference input signal to the voltage sensor, such that the measurement of voltage across the battery cell comprises a formation/testing voltage signal and a reference output signal corresponding to the reference input signal; extracting the reference output signal from the measurement of voltage across the battery cell; and determining the transfer function based on the reference input signal and the reference output signal.

The voltage sensor may comprise an analog-to-digital converter, ADC, wherein the method may further comprise: applying a dither to the reference input signal.

BRIEF DESCRIPTION OF THE DRAWINGS

Aspects of the present disclosure are described, by way of example only, with reference to the following drawings. In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The battery formation/testing controller of the present disclosure is configured to determine the transfer function of a current sensor used to measure the battery cell s during formation/testing. The transfer function may be periodically or intermittently determined, such that any changes in the current sensor may be detected and the output of the current sensor may be corrected to compensate for any changes in the current sensor so that an accurate measurement of current is maintained. The inventors have recognised that by implementing the battery formation/testing controller in this way, a high-quality, stable current sensor is no longer necessary. For example, a current sensor that is more susceptible to change as the temperature changes can be accommodated, since any change in the current sensor can be detected and compensated. As a result, a high accuracy measurement of the current may still be achieved with a relatively low cost current sensor, meaning that high accuracy current control is possible during formation/testing at relatively low cost. Furthermore, any other causes of change to the current sensor, such as sensor drift, may also be corrected for by virtue of the transfer function determination, and recalibration of the system may also be achieved more straightforwardly by virtue of transfer function determination.

Figure 1:
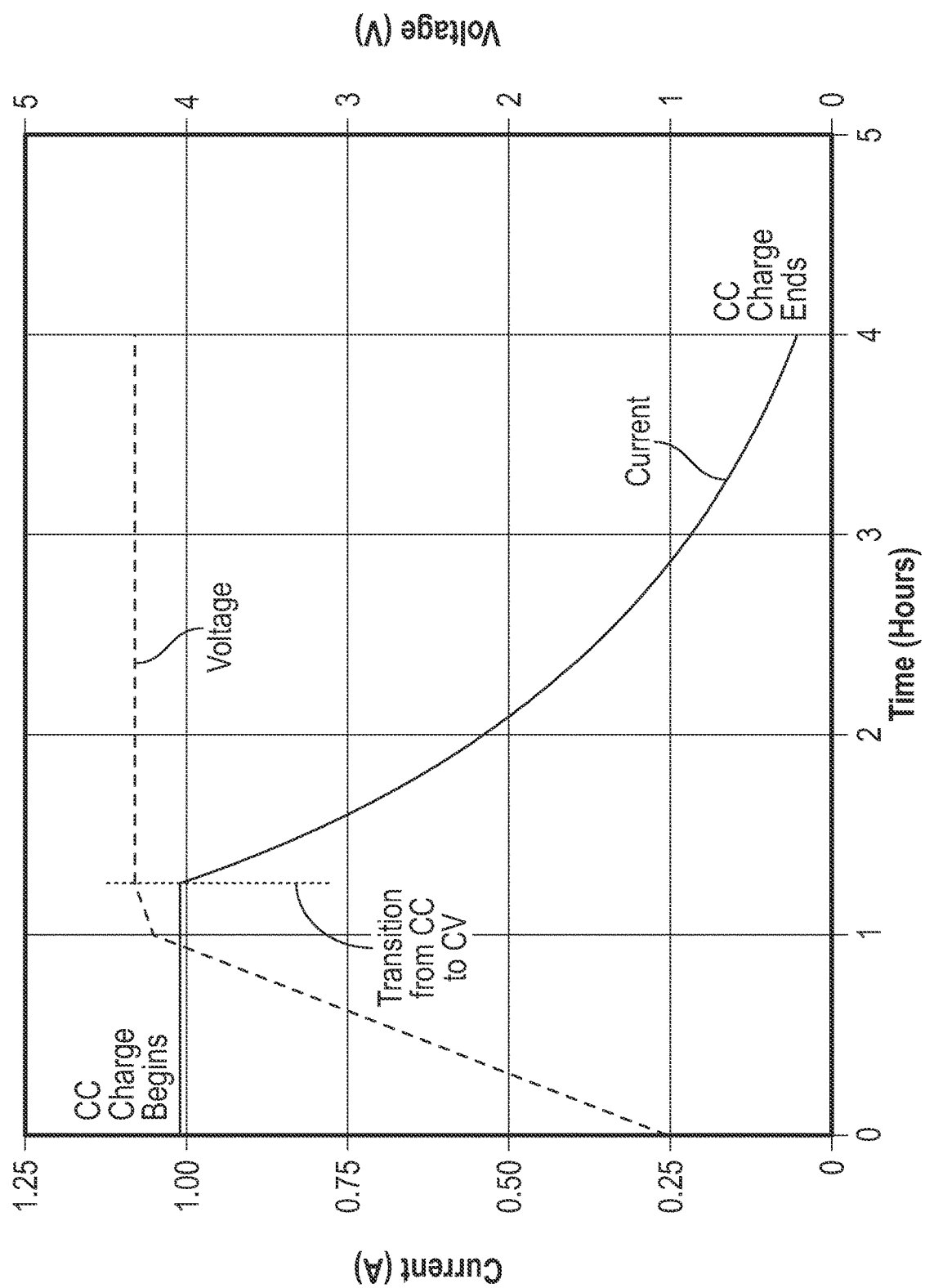
FIG. 1 shows an example battery cell charge profile that may be used during battery formation and/or testing.

FIG. 1 shows an example battery cell charge profile that may be used during battery formation and/or testing. It will be appreciated that there may also be similar battery cell current discharge profiles to be used during battery formation and/or testing. The values of time, current and voltage are merely non-limiting examples and any suitable time, current and voltage relationship may be desired for charging/discharging, for example depending on the nature of the battery cell. In order to control the current that is applied during charging (or to control the current that is discharged), the battery current may be measured using a current sensor. The current sensor may measure current applied to the battery cell during charging as a positive current and current that is output from the battery cell during discharging as a negative current (or vice-versa). The current sensor may comprise a current transducer, such as a shunt resistor, an amplifier to amplify the transducer signal and an analog-to-digital converter (ADC) to measure the amplified signal and output a digital measurement of the battery current. As explained in the background, high current flow during formation/testing may cause significant temperature increases, which can be problematic for maintaining high measurement accuracy and repeatability over time. The ADC may be of a highly accurate design with a highly accurate reference signal, for example with a tempco of about 3 ppm/° C. The shunt resistor may also be selected to have a relatively stable tempco, such as 15 ppm/° C. However, shunt resistors of this type tend to be considerably more expensive than shunt resistors that have a less stable tempco (for example, a shunt resistor with a tempco of about 15 ppm/° C. may be an order of magnitude more expensive than a shunt resistor with a tempco of about 75 ppm/° C.

Figure 2:
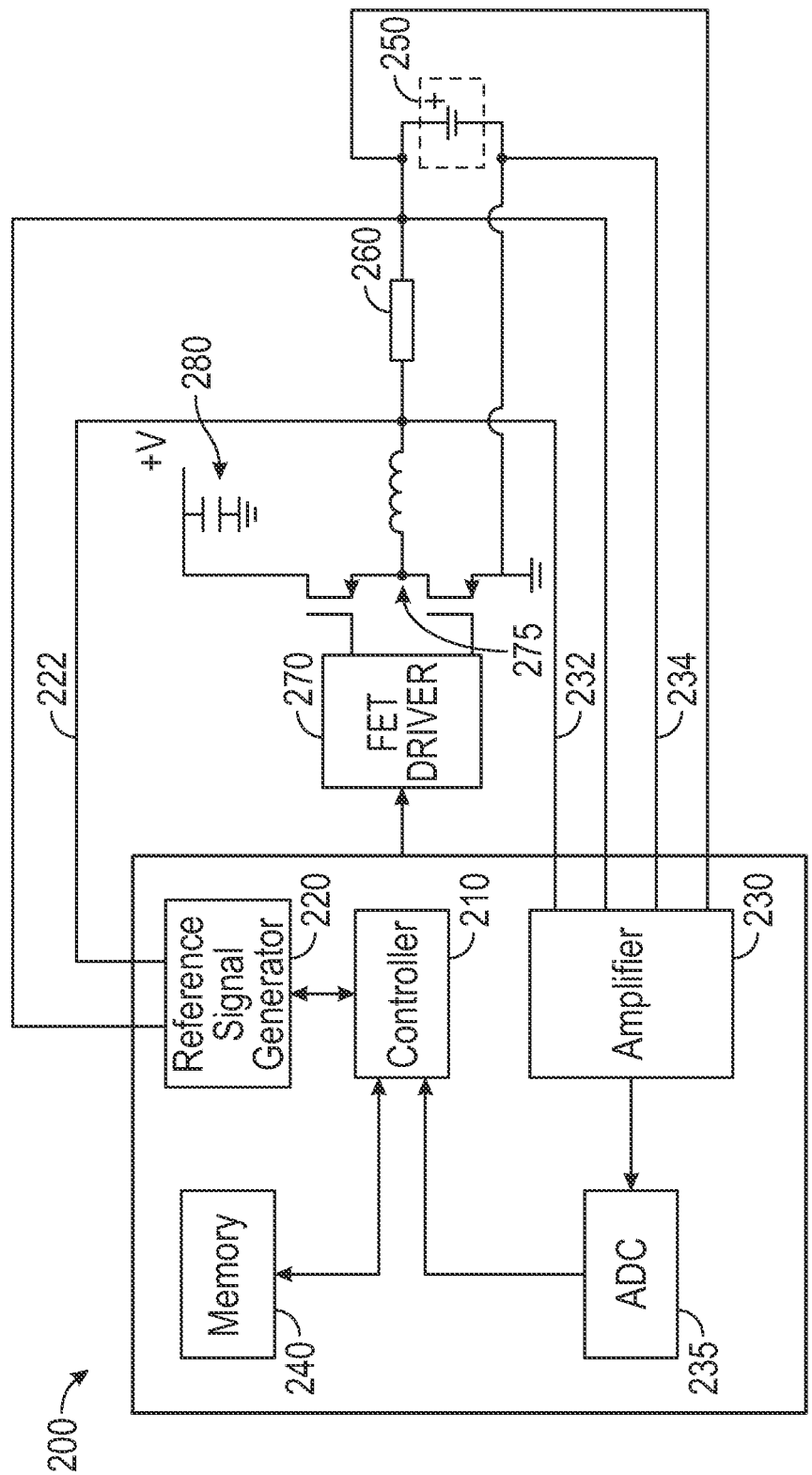
FIG. 2 shows an example battery formation/testing system in accordance with an aspect of the present disclosure.

FIG. 2 shows an example battery formation/testing system 200 in accordance with an aspect of the present disclosure. The system 200 comprises a battery formation/testing controller 210, a reference signal generator 220, an amplifier 230 (such as a PGA, or any other suitable type of amplifier), an analog-to-digital converter (ADC) 235 (such as a SAR ADC, or a Sigma Delta ADC, or a pipelined ADC, or any other suitable type of ADC) and memory 240 (for example volatile memory, such as RAM, or non-volatile memory, such as flash memory, or any other suitable type of memory). The system 200 is suitable for coupling to a battery charge/discharge circuit. The example battery charge/discharge circuit represented in FIG. 2 comprises one or more battery cells 250, a current transducer 260 (which in this example is a shunt resistor, but may alternatively be a current transformer or any other suitable type of current transducer), a FET driver 270, FETS 275 and a current/voltage source 280 (which in this example is a capacitor and a DC supply +V, but may alternatively be any suitable type of current/voltage source). It will be appreciated that FIG. 2 shows one non-limiting example of a circuit that can be used to control battery cell current and/or voltage during formation/testing. The skilled person will appreciate that there are various other circuit configurations that could be used such that the system 200 may control at least part of the circuit to control the battery formation/testing current and/or voltage. The current transducer 260, amplifier 230 and ADC 235 together make up a current sensor that outputs to the formation/testing controller 210 a digital signal indicative of the current flowing through the battery cell 250 (i.e., a measurement of the battery cell current).

The formation/testing controller 210 is suitable for coupling to the FET driver 270 to control the operation of the FETs 275, and therefore control the current and/or voltage applied to the battery cell 250 during charging and/or control the current and/or voltage that is discharged battery cell 250 during discharging. For example, the duty cycle of the two FETs 275 may determine the average voltage at the switched node of the two FETs 275s. The controller 210 may control the FETs 275 to set this average voltage to be higher than the battery cell voltage during charging in order to drive a desired charging formation/testing current into the battery cell 250. Alternatively, it may control the FETs 275 to set this average voltage to be lower than the battery cell voltage during discharging in order to control a desired discharge battery cell current from the battery cell 250. The circuit of FIG. 2 also includes an inductor to slow the rate of change in current, although this is optional. The amplifier 230 is suitable for coupling to the current transducer 260 via the electrical connections 232 in order to receive at the amplifier 230 an analog voltage signal that is indicative of the current flowing through the battery cell 250. That measurement is used by the controller 210 in a process of controlling the formation/testing current of the battery cell 250 to achieve a target charging or discharging current, such as that represented in FIG. 1. In this example implementation the amplifier 230 is also suitable for coupling to the battery cell 250 via the electrical connections 234 in order to receive at the amplifier 230 an analog signal of the voltage across the battery cell 250 so that the amplifier 230 and ADC 235 could also be used for measuring the voltage across the battery cell 250 (for example, by multiplexing the ADC 235 between current signal and voltage signal conversion). However, in an alternative implementation, battery cell voltage may not be measured, or may be measured by a different system or by a dedicated voltage sensor component(s) in the system 250.

The system 200 is configured so that the battery formation/testing controller 210 can determine the transfer function of the current sensor (which may include the entire current measurement signal chain comprising the current transducer 260, the amplifier 230 and the ADC 235). The inventors have recognised that by configuring the system 200 in this way, any changes in the transfer function of the current sensor (for example, as a result of temperature changes caused by charging currents) may be detected and corrected for during the formation/testing process. Consequently, a current transducer 260 with a poorer tempco than previous systems may be used, thereby saving costs. For example, a shunt resistor with a tempco of about 15 ppm/° C. may previously have been required, at a unit cost of about 10 USD. However, by configuring the system to determine and track the transfer function of the current sensor, a shunt resistor with a tempco of about 75 ppm/° C. (by way of non-limiting example) may be used, at a unit cost of about 1 USD. Where a plurality of battery cells (such as 10 s, 100 s, or 1000 s) are undergoing formation/testing in parallel, each battery cell may require its own charge/discharge circuit with its own shunt resistor. Therefore, cost savings in the shunt resistor quickly add up to significant savings overall. Likewise, if the current transducer 260 is instead a current transformer, a current transformer with a poorer tempco than previously possible may be used.

Further benefits also include the ability to continually or intermittently update the determined transfer function without requiring time consuming, complex re-calibration of the system, such that any long-term sensor drift may easily be corrected for. Furthermore, it may be possible to lengthen the time period between recalibrations, since it can be detected whether or not recalibration is required rather than simply following set recalibration schedules. Furthermore, any changes in any part of the current measurement signal chain may be detected by determining the transfer function and therefore compensated for. As a result, accuracy of control of the formation/testing current of the battery cell 250 may be even further improved.

Figure 3:
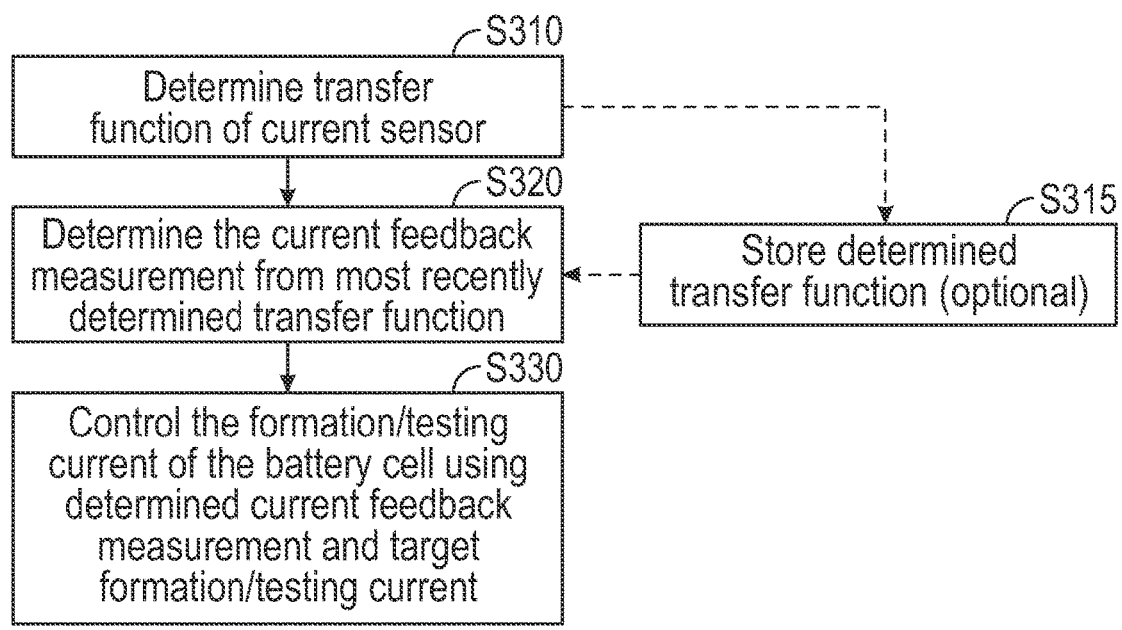
FIG. 3 shows a representation of example processes performed by the battery formation/testing controller of the battery formation/testing system of FIG. 2.

FIG. 3 shows a representation of an example processes performed by the battery formation/testing controller 210 in accordance with an aspect of the present disclosure. In Step S310, a transfer function of the current sensor is determined. The transfer function of the current sensor may be determined in any suitable way. In the particular example system 200 configuration represented in FIG. 2, the reference signal generator 220 is suitable for coupling to the current transducer 260 via electrical connections 222 so that it may apply/inject a reference input signal $M_1$ to the current sensor. The reference input signal $M_1$ may be any suitable time varying signal, such as a square wave signal, a trapezoid signal, a sinusoidal signal, etc. As a result, the measurement of the current flowing through the battery cell 250 will comprise two main components: the primary, battery cell current signal X (the formation/testing current signal, which may, for example, be a DC or low frequency current signal); and a reference output signal $M_2$ that corresponds to the reference input signal $M_1$ and has a different frequency characteristic to signal X (for example, it may be a higher frequency component in the measurement of the battery cell current, caused by the injected reference input signal $M_1$). The reference signal generator 220 may apply the reference input signal to the current sensor for a period of time, during which the battery formation/testing controller 210 may sample and average the measurement of the battery cell current. The battery formation/testing controller 210 may then extract the reference output signal $M_2$ from the averaged measurement of the battery cell current (for example, using a time-domain algorithm such as accumulations for sections, or frequency-domain algorithms, such as FFT/Goertzel analysis) and determine the transfer function by comparing $M_1$ to $M_2$. For example, the transfer function may be determined by comparing the amplitudes of $M_1$ and $M_2$.

Further details of how the transfer function of the current sensor may be determined by applying a reference input signal to the current sensor are given in patent application WO2013/038176A2, which is incorporated herein by reference in its entirety. For example, line 14, page 49, to line 5, page 51, describes an example process by which the transfer function of a current sensor may be determined using a known reference input signal.

Optionally, the process may proceed to Step S315, where the determined transfer function is stored in memory 240 for use later.

In Step S320, a current feedback measurement is determined by the battery formation/testing controller 210. The current feedback measurement is indicative of the formation/testing current of the battery cell (i.e., the current applied to the battery cell 250 during charging, or the current output from the battery cell 250 during discharging). The determination of the current feedback measurement is based on the transfer function of the current sensor and the measurement of the battery cell current (i.e., the signal output by the current sensor). If the reference signal generator 220 is still operating to apply the reference input signal to the current sensor, the measurement of battery cell current may include two main components, $M_2$ and X (as explained above). The formation/testing current signal (component X) may be isolated or extracted by any suitable means, for example by filtering or by FFT to remove the reference output signal (component $M_2$), etc. In an alternative, once Step S310 is complete, the controller 210 may turn off the reference signal generator, or disconnect it from the current sensor, in which case the measurement of battery cell current may include only the formation/testing current. The previously determined transfer function of the current sensor may then be used to modify the formation/testing current signal (component X) as appropriate in order to arrive at a more accurate current feedback measurement that takes into account any changes or drift in the transfer function of the current sensor.

By way of example, at initial calibration of the system 200 and circuit, the transfer function of the current sensor may be determined to be TF0. This value may be stored in memory 240. During formation/testing, the transfer function may be determined to be TF1. The ratio of TF1/TF0 may be indicative of any change in gain of the current sensor compared with initial calibration. Any change in gain may then be corrected in the formation/testing current signal (component X) so that the determined current feedback measurement has been corrected for gain changes.

In Step S330, the formation/testing controller 210 uses the determined current feedback measurement and a target formation/testing current to control the formation/testing current of the battery cell 250. For example, a particular target formation/testing current may be desired, such as that represented in FIG. 1, and may be stored in memory 240. The current feedback measurement may be compared against the target and the controller 210 may adjust its control timing of the FETs 275 in order to increase or decrease the battery cell current as necessary.

Steps S320 and S330 may be repeated intermittently or periodically during battery formation/testing. In this case, if the transfer function determined in Step S310 is stored in memory 240 in Step S315, in Step S320 the most recently determined transfer function may be obtained from memory 240 and used to determine the current feedback measurement. Steps S320 and S330 may either use a single sample of the output of the ADC 235 and determine the current feedback measurement using that single sample, or may average a plurality of samples over time and determine the current feedback measurement from the average. The process may periodically or intermittently determine a further or updated transfer function by returning to Step S310. For example, every minute, or every two minutes, or every five minutes, etc the process may return to Step S310 to determine an updated transfer function that is then stored in Step S315. Steps S320 and S330 may then be repeated on loop in between transfer function updates. Alternatively, on completion of S330, the process may always return to S310, such that the transfer function is continually updated.

Optionally, during Steps S320 and S330, the controller 210 may turn off or disconnect the reference signal generator 220 so that the reference input signal is no longer applied to the current sensor. Alternatively, the reference signal generator 220 may always apply the reference input signal, and the formation/testing current signal (component X) extracted from the measurement of the current flowing through the battery cell, for example by filtering or FFT, etc.

According to the process of FIG. 3, any changes in the current sensor may be detected and compensated on a regular or continual basis. In this way, a lower cost current transducer 260 may be used with a relatively poor tempco, whilst still maintaining a high level of current control accuracy. Furthermore, it is possible that other contributors to gain change in the current sensor may also be detected and compensated, thereby even further improving the accuracy of current control. Furthermore, initial calibration of the system 200 and circuit may be simplified by using the process to determine the initial transfer function TF0 of the current sensor and store that in memory 240. Furthermore, more straightforward re-calibration may be achieved throughout the lifetime of the system 200 and circuit, by recalculating TF0 at any suitable time and updating the value for TF0 stored in memory 240.

Figure 4:
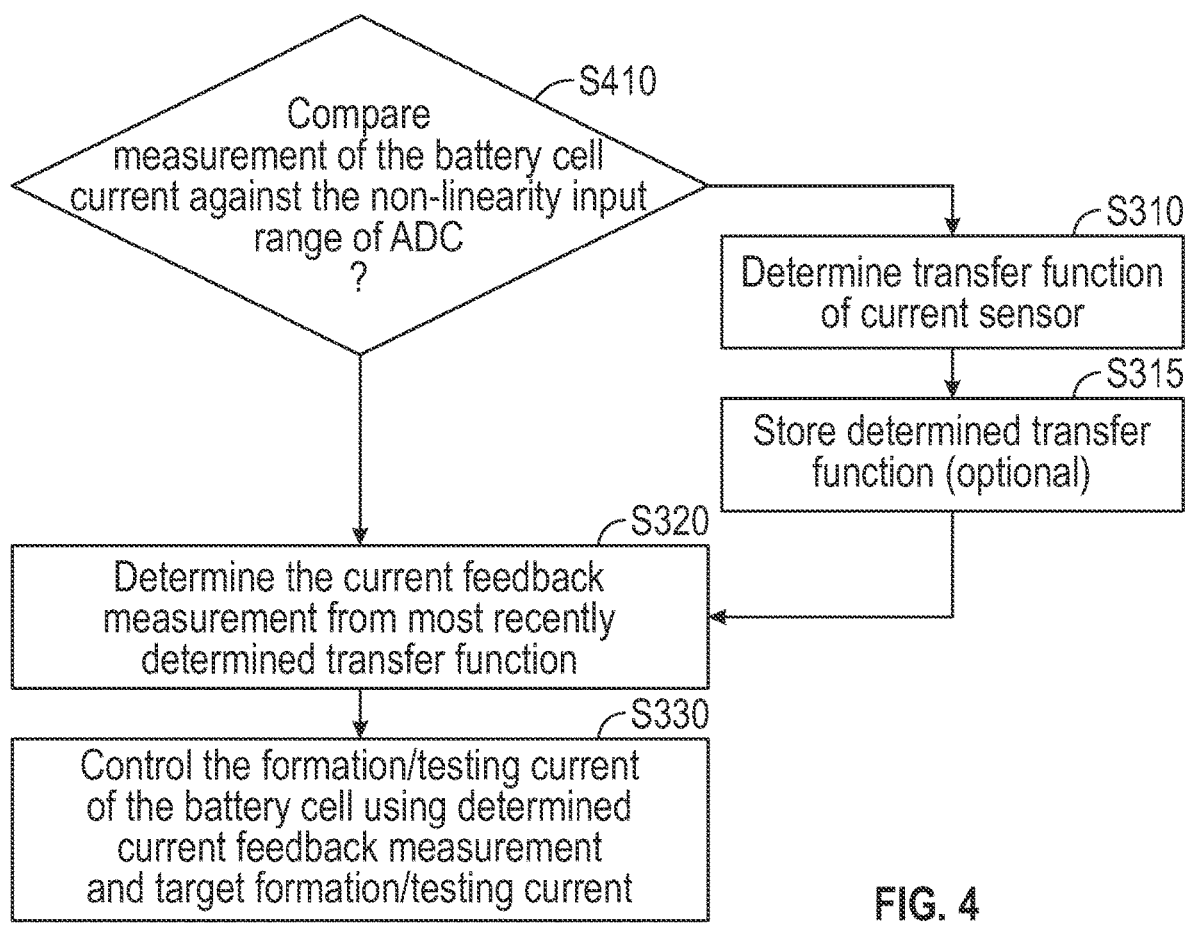
FIG. 4 shows a representation of a further example processes performed by the battery formation/testing controller of the battery formation/testing system of FIG. 2.

FIG. 4 shows a representation of a further example processes performed by the battery formation/testing controller 210 in accordance with an aspect of the present disclosure. Many types of ADC 235 may have a non-linearity input range of input signals where analog input signals are converted non-linearly to digital output signals. For example, the ADC may have particular ranges of input signals where a linear change in the input analog signal does not result in a linear change in the output digital signal. This may cause some inaccuracies in the determination of the transfer function of the current sensor.

For example, the reference input signal may be a square wave signal varying between two levels, level1 and level2. The ADC 235 will convert the signal in the measurement of the battery cell current that results from level1 (we will call this signal level1') to be data1=level1'+error1, where error1 is an ADC conversion error. The ADC 235 will convert the signal in the measurement of the battery cell current that results from level2 (we will call this signal level2') to be data2=level2'+error2, where error2 is an ADC conversion error. To determine the transfer function of the current sensor, the controller 210 may compare the amplitude of the reference input signal (i.e., level2−level1) against the amplitude of the $M_2$ component of the current flowing through the battery cell 250 (i.e., data2−data1=(level2'−level1')+(error2−error1)).

If the ADC 235 is operating in its linear region, error2 and error1 should be similar, for example both being positive or both being negative. This should result in the overall error in data2−data1 being relatively small, such that data2−data1 is a relatively accurate representation of level2'−level1'. For example, if error1=+0.3 LSB and error2=0.2 LSB, the overall error in data2−data1 may be 0.1 LSB. However, if the ADC 235 is operating in its non-linear region, error2 and error1 may be quite different, for example one being positive and the other being negative. This may result in the overall error in data2−data1 being relatively large, such that data2−data1 is a less accurate representation of level2'−level1'. For example, if error1=+0.3 LSB and error2=−0.2 LSB, the overall error in data2−data1 may be 0.5 LSB.

Returning to FIG. 4, in Step S410 the controller 210 may compare the measurement of the battery cell current (for example, just the formation/testing current signal (component X), or the whole signal X+M$_2$) against the non-linearity input range of the ADC 210. The comparison may be based on an average, such as the RMS, of the measurement of the battery cell current, or any other suitable value of the measurement of the battery cell current. The non-linearity input range of different types of ADC may be known, for example from testing or data sheets, and stored in memory 240 during manufacture or calibration of the system 200. If the measurement of the battery cell current is outside of the non-linearity input range (i.e., the ADC 235 is operating in its linear region), the process may proceed to step S310, where the transfer function of the current sensor is determined as described above. If the measurement of the battery cell current is within the non-linearity input range, the process may proceed to step S320. In this case, the current feedback measurement is determined using a previously determined value of the transfer function stored in memory 240. For example, each time the transfer function is determined in Step S310 it may be stored in memory as the most recently determined transfer function (Step S315) and then the current feedback measurement may be determined in Step S320 using the stored most recently determined transfer function. In this way, the transfer function may be determined only when the ADC 235 is operating in its linear region, thereby improving the accuracy of the determined transfer function.

Once Step S330 is complete, the process may return to Step S320, and/or may periodically or intermittently return to Step S410 whenever an update to the transfer function is desired. In this way, the transfer function may be accurately determined and the current applied to the battery cell 250 throughout the formation/testing process may be accurately controlled.

In a further example implementation of the present disclose, dither may be applied to the reference input signal in order to improve the randomisation of quantisation noise in the output of the ADC 235 and therefore improve the accuracy of transfer function determination. During the battery formation/testing, the formation/testing current of the battery cell 250 may be mainly a DC signal or low frequency signal, sometimes with a small ripple (for example, an approximately 2 mVpp sinewave). The predominantly DC nature of the signal may result in quantization noise in the output of the ADC 235 lacking randomisation and being too determination. Randomisation of quantization noise may be beneficial for noise reduction/cancellation when multiple samples of the output of the ADC 235 are averaged in the process of determining the transfer function and/or the current feedback measurement.

In order to improve the randomisation of the quantisation noise, the reference signal generator 220 may apply a dither to the reference input signal. Various different types of dither may be applied.

Figure 5:
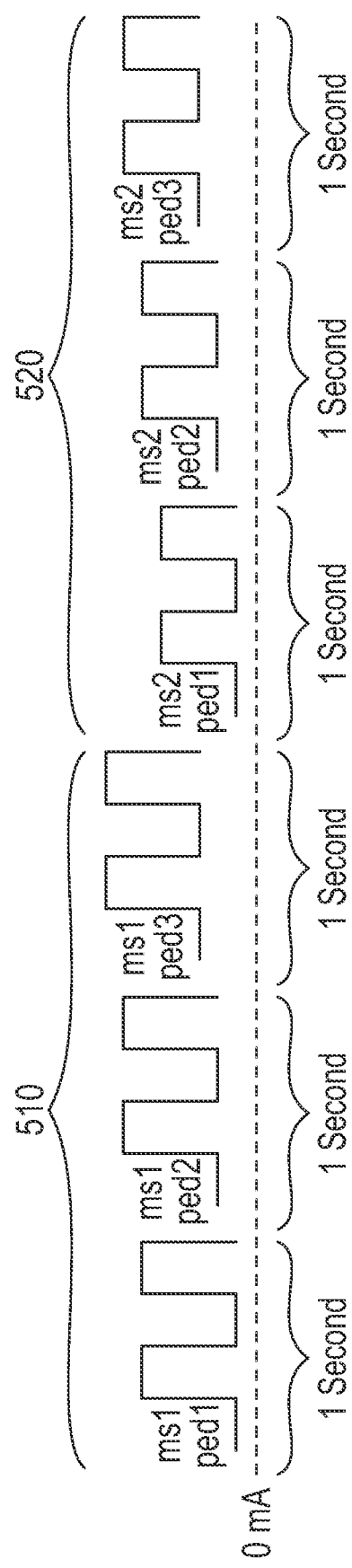
FIG. 5 shows an example representation of different types of dither that may be used for the reference input signal applied to the current sensor of FIG. 2 during transfer function determination.

FIG. 5 shows an example representation of two different types of dither that may be applied to the reference input signal. Either one or both of these different types may be used. In this example the reference input signal is a square wave signal, but the same principles may also be applied to any other suitable type of reference input signal.

Reference numeral 510 relates to a dither that transposes the reference input signal. In this example, the reference input signal is transposed between three signal levels, but any number of signal levels (two or more) may be used. The term 'transposed' describes the peak-to-peak amplitude of the reference input signal ('ms1' in FIG. 5) remaining the same, but the average of the signal level changing between three signal levels ('ped1', 'ped2' and 'ped3' in FIG. 5). In this particular example, for the first second the reference input signal has a first average signal level, then in the second it is increased to a second average signal level, then in the third it is increase to a third average signal level. In this example, because the peak-to-peak amplitude of the input reference signal does not change, no modification to the transfer function determination process should be required, since that considers a difference between the peak-to-peak amplitude of the reference input signal and the reference output signal.

Reference numeral 520 relates to a dither where the reference input signal is modulated. In particular, the peak-to-peak amplitude of the reference input signal is changed compared with the signal represented in reference numeral 510 (in this example it is decreased to 'ms2', but it could alternatively be increased). In this particular example, the signals 520 are then also transposed between three different signal levels, as described above. Where dithering involves a change in peak-to-peak amplitude of the reference input signal, the transfer function determination performed by the controller 210 may require modification. In the example represented in FIG. 5, each of the six different reference input signals are applied for one second each. The output of the ADC 235 may be sampled and averaged over the total six second period and the average reference output signal M$_2$ extracted. The amplitude of the averaged reference output signal M$_2$ may be compared against an average of the amplitude of the reference input signal during the six second period (which in this example will be halfway between the amplitude of the reference input signal during the first three seconds and the amplitude of the reference input signal during the second three seconds). This is merely one non-limiting example and any number of changes to the amplitude of the reference input signal may be applied, each change may last for any suitable amount of time (all of an equal amount of time, or differing amounts of time) and the reference input signal may be applied for any suitable amount of time (not just for a total of six seconds).

It will be appreciated that the dither applied to the reference input signal may comprise transposing the reference input signal between two or more different signal levels and/or modulating the amplitude of the reference input signal between two or more different amplitudes. Additionally or alternatively, any other suitable types of dither may be applied to the reference input signal. The controller 210 may be configured to control the operation of the reference signal generator 220 during transfer function determination, for example setting the type of dither used, such that any changes in amplitude of the reference input signal may be correctly accounted for in the transfer function determination process.

The skilled person will readily appreciate that various alterations or modifications may be made to the above described aspects of the disclosure without departing from the scope of the disclosure.

The functionality of the controller 210 may be implemented by software, hardware or a combination of software and hardware. For example, its functionality may be implemented by software comprising computer readable code, which when executed on the processor of any electronic device, performs the functionality described above. The software may be stored on any suitable computer readable medium, for example a non-transitory computer-readable medium, such as read-only memory, random access memory, CD-ROMs, DVDs, Blue-rays, magnetic tape, hard disk drives, solid state drives and optical drives. As such, the system 200 may comprise any suitable hardware, such as one or more processors, or a microcontroller, or any other suitable form of logic, that is configured to perform the functionality described above, or execute software configured to perform the functionality described above.

The components represented in system 200 may all be implemented within a single device or IC. Alternatively, one or more of the represented components may form part of a separate device or IC that is suitable for coupling to the main device or IC. The system 200 may optionally comprise any number of additional components or devices, either related or unrelated to the battery formation/testing functionality. Furthermore, the different logical entities within the system 200 of FIG. 2 are represented as separate entities interfacing with each other. It will be appreciated that the particular representation of FIG. 2 is used merely for the benefit of understanding the operation of the system 200 and any one or more of the represented entities may be combined into a single entity, or sub-divided into two or more sub-entities.

The system 200 may optionally not include an amplifier 230, for example where the received analog signal does not require amplification. Additionally or alternatively, the ADC 235 may be omitted, for example where the controller 210 is configured to operate in the analog domain.

Optionally, the above described process may also be applied to controlling the formation/testing voltage across the battery cell 250 and/or may be applied to controlling the voltage across the battery cell 250 during discharge. In particular, the transfer function of a voltage sensor arranged to measure the voltage across the cell (for example, the amplifier 230 and ADC 235, coupled to the battery cell 250 by electrical connections 234) may be determined in any suitable way, such as one analogous to the reference signal implementation described above by injecting a reference input signal to the voltage sensor. Some example processes for determining the transfer function of a voltage sensor are disclosed in WO2014/072733 particularly in relation to FIGS. 4A-4F, 5A-5C, 6A and 6B), which is incorporated herein by reference in its entirety. A voltage feedback measurement may then be determined based on the determined transfer function of the voltage sensor and a measurement of the voltage across the battery cell 250 output from the voltage sensor. Optionally, the voltage sensor may also include a potential divider coupled across the battery cell 250 in order to divide down the voltage measured by the ADC 235, where the ADC 235 is coupled in parallel with one of the resistors of the potential divider using electrical connections 234. In this case, the reference input signal may be injected on one side of the potential divider, as described in more detail with reference to FIGS. 4A-4F of WO2014/072733). The controller 210 may then control the operation of the FETs 275, or any other suitable component, based on the voltage feedback measurement and a target formation/testing voltage in order to achieve the desired formation/testing voltage. Optionally, the voltage across the battery cell 250 may additionally or alternatively be monitored/set more accurately during a discharge cycle using an analogous process. Furthermore, any of the earlier described optional processes, such as determining the transfer function at times when the analog input to the ADC is outside of the non-linearity input range, or applying a dither to the reference input signal, may be used in respect of voltage sensor transfer function determination.

The controller 210 may be configured to control/measure only the voltage across the battery cell 250 in this way, or control/measure only the current flowing through the battery cell 250 in this way, or may be configured to control/measure both the current flowing through the battery cell 250 and the voltage across the battery cell 250 in this way (for example, by determining the transfer function of the current sensor by applying a reference input signal to at least part of the current sensor, and by determining the transfer function of the voltage sensor by applying the same or different reference input signal to at least part of the voltage sensor).

Whilst a particular transfer function determination technique involving the application of a reference input signal is described above, it will be appreciated that the system 200 may alternatively determine the transfer function of the current sensor and/or voltage sensor in any other suitable way.

The invention claimed is:

1. A battery formation/testing controller for controlling a formation/testing current of a battery cell and for coupling to a current sensor arranged to output a measurement of battery cell current, the battery formation/testing controller being configured to:
   determine a transfer function of the current sensor;
   determine a current feedback measurement indicative of the formation/testing current of the battery cell, wherein determination of the current feedback measurement is based on the transfer function of the current sensor and the measurement of the battery cell current; and
   control the formation/testing current of the battery cell based on a target formation/testing current and the determined current feedback measurement.

2. The battery formation/testing controller of claim 1, wherein the current sensor comprises an analog-to-digital converter, ADC, having a non-linearity input range of input signals where analog input signals are converted non-linearly to digital output signals, the battery formation/testing controller further configured to:
   compare the measurement of the battery cell current against the non-linearity input range; and
   if the measurement of the battery cell current is outside of the non-linearity input range:
   determine the transfer function of the current sensor.

3. The battery formation/testing controller of claim 1, further configured to determine the transfer function of the current sensor by:
   applying a reference input signal to the current sensor, such that the measurement of the battery cell current comprises a formation/testing current signal and a reference output signal corresponding to the reference input signal;
   extracting the reference output signal from the measurement of the battery cell current; and
   determining the transfer function based on the reference input signal and the reference output signal.

4. The battery formation/testing controller of claim 3, wherein the current sensor comprises an analog-to-digital converter, ADC, and wherein the battery formation/testing controller is further configured to:
   apply a dither to the reference input signal.

5. The battery formation/testing controller of claim 4, wherein applying the dither to the reference input signal comprises:
   transposing the reference input signal between at least two signal levels.

6. The battery formation/testing controller of claim 4, wherein applying the dither to the reference input signal comprises:
modulating an amplitude of the reference input signal.

7. The battery formation/testing controller of claim 1, further configured to:
read the transfer function of the current sensor from memory.

8. The battery formation/testing controller of claim 7, further configured to:
determine a further transfer function of the current sensor;
determine a further current feedback measurement based on the further transfer function and a further measurement of the battery cell current output by the current sensor; and
control the formation/testing current of the battery cell based on the target formation/testing current and the determined further current feedback measurement.

9. The battery formation/testing controller of claim 8, further configured to:
store in memory the further transfer function for use in determining future current feedback measurements.

10. The battery formation/testing controller of claim 1, further configured to control the formation/testing current of the battery cell by:
controlling operation of one or more transistors configured to control a magnitude of the formation/testing current.

11. The battery formation/testing controller of claim 1, wherein the formation/testing current is a charging current applied to the battery cell or a discharge current output from the battery cell.

12. The battery formation/testing controller of claim 1, further configured to:
determine a voltage feedback measurement indicative of the formation/testing voltage across the battery cell, wherein determination of the voltage feedback measurement is based on a transfer function of a voltage sensor coupled across the battery cell and a measurement of the voltage across the battery cell from the voltage sensor; and
control the formation/testing voltage across the battery cell based on a target formation/testing voltage and the determined voltage feedback measurement.

13. A battery formation/testing system comprising:
an analog-to-digital converter, ADC, for coupling to a current transducer that is arranged to generate an analog signal indicative of a battery cell current of a battery cell; and
a battery formation/testing controller coupled to a digital output of the ADC and configured to:
determine a transfer function of a current sensor;
determine a current feedback measurement indicative of a formation/testing current of the battery cell, wherein determination of the current feedback measurement is based on the transfer function of a current sensor and the digital output of the ADC; and
control the formation/testing current of the battery cell based on a target formation/testing current and the determined current feedback measurement.

14. The battery formation/testing system of claim 13, wherein the current transducer comprises a shunt resistor.

15. The battery formation/testing system of claim 13, wherein the battery formation/testing controller is configured to:
read the transfer function of the current sensor from memory.

16. The battery formation/testing system of claim 15, wherein the battery formation/testing controller is further configured to:
determine a further transfer function of the current sensor;
determine a further current feedback measurement based on the further transfer function and a further measurement of the battery cell current output by the current sensor; and
control the formation/testing current of the battery cell based on the target formation/testing current and the determined further current feedback measurement.

17. A method for controlling a formation/testing current of a battery cell, the method comprising:
determining a transfer function of a current sensor;
determining a current feedback measurement indicative of the formation/testing current of the battery cell, wherein determination of the current feedback measurement is based on:
a transfer function of the current sensor that is arranged to output a measurement of battery cell current; and
the measurement of battery cell current; and
controlling the formation/testing current of the battery cell based on a target formation/testing current and the determined current feedback measurement.

18. The method of claim 17, wherein the current sensor comprises an analog-to-digital converter, ADC, having a non-linearity input range of input signals where analog input signals are converted non-linearly to digital output signals, the method further comprising:
comparing the measurement of the battery cell current against the non-linearity input range; and
if the measurement of the battery cell current is outside of the non-linearity input range:
determining the transfer function of the current sensor.

19. The method of claim 17, further configured to determine the transfer function of the current sensor by:
applying a reference input signal to the current sensor, such that the measurement of the battery cell current comprises a formation/testing current signal and a reference output signal corresponding to the reference input signal;
extracting the reference output signal from the measurement of battery cell current; and
determining the transfer function based on the reference input signal and the reference output signal.

20. The method of claim 19, wherein the current sensor comprises an analog-to-digital converter, ADC, and wherein the method further comprises:
applying a dither to the reference input signal.

* * * * *